United States Patent
Sardat

(10) Patent No.: US 6,946,829 B2
(45) Date of Patent: Sep. 20, 2005

(54) DEVICE FOR MEASURING A CHOPPED CURRENT

(75) Inventor: Pierre Sardat, Villemomble (FR)

(73) Assignee: Valeo Electronique et Systems de Liaison, Montigny le Bretonneux (FR)

( * ) Notice: Subject to any disclaimer, the term of this patent is extended or adjusted under 35 U.S.C. 154(b) by 0 days.

(21) Appl. No.: 10/490,512

(22) PCT Filed: Oct. 19, 2002

(86) PCT No.: PCT/FR02/03211

§ 371 (c)(1),
(2), (4) Date: Sep. 2, 2004

(87) PCT Pub. No.: WO03/028198

PCT Pub. Date: Apr. 3, 2003

(65) Prior Publication Data

US 2005/0012497 A1  Jan. 20, 2005

(30) Foreign Application Priority Data

Sep. 21, 2001  (FR) .............................. 01 12220

(51) Int. Cl.⁷ .............................................. G01R 19/00
(52) U.S. Cl. .................................................. 324/117 R
(58) Field of Search ........................ 324/117 R, 120, 324/127; 363/20–21

(56) References Cited

U.S. PATENT DOCUMENTS

| 5,636,108 A | * | 6/1997 | Taurand | ....................... 363/20 |
| 5,745,351 A | * | 4/1998 | Taurand | ....................... 363/20 |
| 6,121,768 A | * | 9/2000 | Taurand | ................... 324/117 R |

FOREIGN PATENT DOCUMENTS

DE         3727170 A    2/1989

* cited by examiner

*Primary Examiner*—Vinh P. Nguyen
(74) *Attorney, Agent, or Firm*—James R. Williams

(57) ABSTRACT

This device for measuring a chopped current ($i_e$) includes a pulse transformer (10). The transformer includes a primary circuit (12) in which the chopped current flows and a secondary circuit (14) in which there flows an output current ($i_s$) that is proportional to the chopped current, the secondary circuit of the transformer having two output terminals (16, 18) between which there is connected an output current measuring circuit (22). The measuring circuit further includes transformer demagnetizing means (20). The measuring circuit includes a switch (32) and means (33) for synchronizing said switch with the chopped current ($i_e$) to enable the output current ($i_s$) to flow through the measuring circuit (22) whenever the chopped current is strictly positive and whenever it is strictly negative, and to prevent any flow of current through the measuring circuit when the chopped current is zero.

5 Claims, 2 Drawing Sheets

DEVICE FOR MEASURING A CHOPPED CURRENT

BACKGROUND OF THE INVENTION

The present invention relates to a device for measuring a chopped current, the device being of the type including a pulse transformer.

The transformer comprises a primary circuit in which the chopped current flows and a secondary circuit in which there flows an output current that is proportional to the chopped current, the secondary circuit of the transformer including two output terminals with an output current measuring circuit connected therebetween. In addition, the measuring device includes means for demagnetizing the transformer.

To a first approximation, the imperfections of a pulse transformer can be modelled by a parasitic inductance placed between the output terminals of the secondary circuit. Thus, a negligible fraction of the output current flows through this parasitic inductance. However this negligible fraction of the current, referred to as the "magnetizing current", increases, given the potential difference maintained across the terminals of the parasitic inductance. This phenomenon referred to as the magnetization phenomenon appears as soon as the output current is measured in the measuring circuit.

Consequently, it is necessary to demagnetize the pulse transformer regularly, e.g. by making the magnetizing current flow through a demagnetizing circuit.

In general, when such a measuring device is applied to measuring a chopped current flowing in a direct current to direct current converter (DC to DC converter), the measuring circuit is constituted by a resistor connected in series with a first diode.

The demagnetizing circuit is generally constituted by a zener diode connected in series with a second diode connected in the opposite direction to the zener diode, so as to prevent any current flowing through the demagnetizing circuit while current is flowing through the measuring circuit in the direction allowed by the first diode, and conversely for allowing current to flow through the demagnetizing circuit while the first diode prevents current from flowing in the measuring circuit.

Thus, that device enables a single direction chopped current flowing in the primary circuit of the transformer to be measured. The output current induced in the secondary circuit is allowed to flow through the measuring circuit for only one of the two possible directions of current flow through the primary circuit of the transformer, the conducting direction of the first diode. This output current is proportional to the input current since the magnetizing current can be considered as being negligible. However, it cannot flow through the demagnetizing circuit, whether in a first direction because it is prevented by the second diode, or in the opposite direction because it is prevented by a positive potential difference.

Thus, the output current flows entirely through the measuring circuit and the input current $i_e$ can be deduced by measuring the output voltage $V_s$ across the terminals of the output resistor of resistance $R_s$, in application of the following formula:

$$i_e = \frac{V_s}{R_s} \times \frac{N_s}{N_p}$$

where $N_s$ is the number of turns in the secondary circuit of the pulse transformer and $N_p$ is the number of turns in the primary circuit of that transformer.

The demagnetizing operation is performed when the input current induces an output current that is zero or that is prevented from flowing through the measuring circuit because it is stopped by the first diode. The magnetizing current can thus flow freely and solely through the demagnetizing circuit, thereby enabling the energy accumulated in the parasitic inductance to be released.

The major drawback to that device is its single-directional nature. It can measure the chopped current in one direction only.

Unfortunately, it can be necessary to measure a chopped current having a mean value of zero, e.g. in order to measure the chopped current flowing in a DC-DC converter interconnecting two power-supply batteries of different voltages. Under such circumstances, the current that is to be measured necessarily includes both positive values and negative values.

SUMMARY OF THE INVENTION

The invention seeks to remedy the drawbacks of a conventional measuring device by creating a chopped current measuring device that is capable of measuring all non-zero values of said current at any instant, even if the current is bidirectional.

The invention thus provides a device for measuring chopped current of the above-specified type, the device being characterized in that the measuring circuit comprises a switch and means for synchronizing the switch with the chopped current so as to enable the output current to flow through the measuring circuit whenever the chopped current is strictly positive and whenever it is strictly negative, and to prevent any flow of current through the measuring circuit whenever the chopped current is zero.

Thus, the measuring device of the invention does not require the presence of the first diode in the measuring circuit, since it is advantageously replaced by the switch and the synchronizing means. The switch allows the output current to flow in both directions in the measuring circuit while also enabling the necessary demagnetization of the secondary circuit of the transformer to take place whenever the chopped current is zero.

The measuring device of the invention may further comprise one or more of the following features:

- the switch is a metal-oxide-silicon field effect transistor (MOSFET) or a bipolar junction transistor;
- the demagnetizing means comprise a demagnetizing circuit connected between the two output terminals of the secondary circuit of the transformer;
- the demagnetizing circuit comprises two zener diodes connected in series and in opposite directions, and the switch is bidirectional in the non-conductive state (OFF) and in the conductive state (ON); and
- the switch comprises two MOSFETs connected in series and in opposite directions in the measuring circuit.

The invention will be better understood on reading the following description given purely by way of example and made with reference to the accompanying drawings, in which:

DETAILED DESCRIPTION OF THE INVENTION

Figure 1:
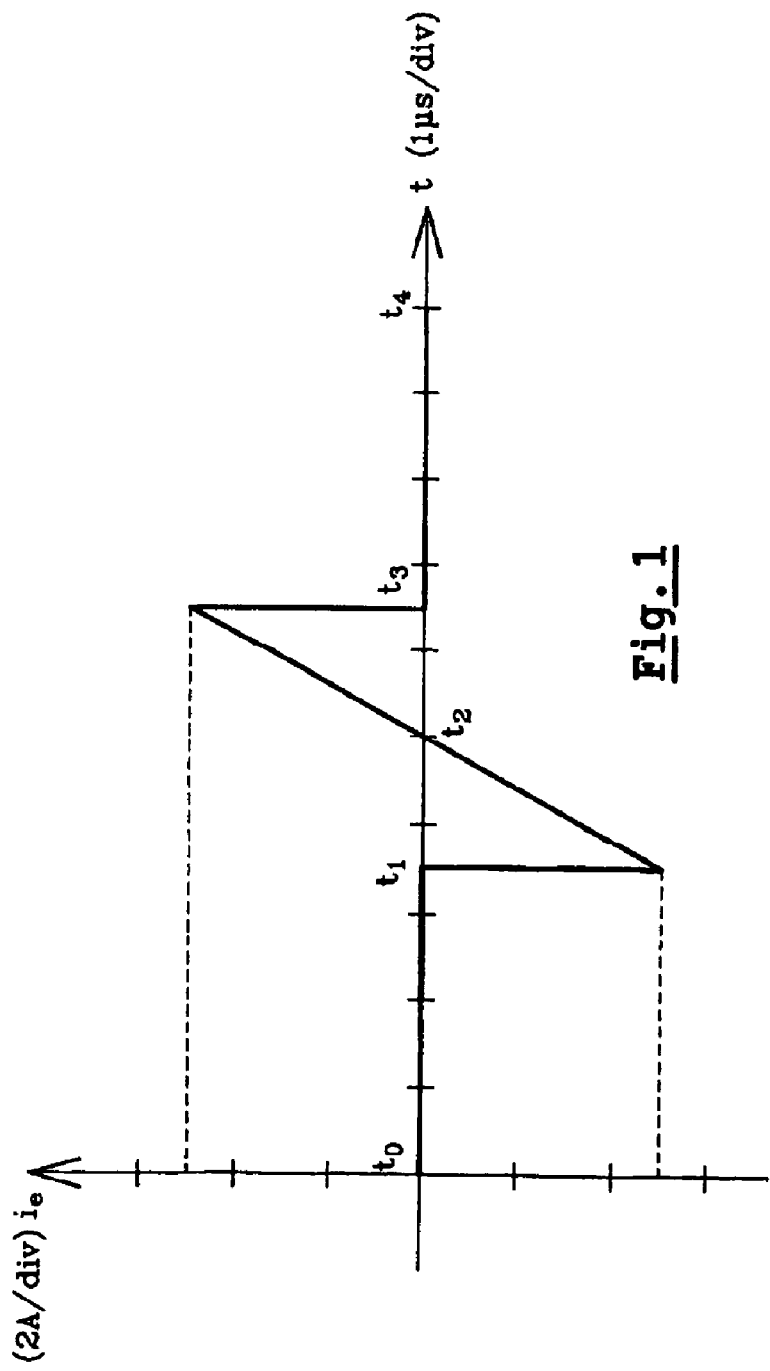
FIG. 1 shows the variation in the magnitude as a function of time of a bidirectional chopped current that can be measured by a device of the invention.

The chopped current $i_e$ whose appearance as a function of time is shown in FIG. 1 is periodic, with a period equal to 10 microseconds ($\mu s$).

Over one period, between an instant to $T_0=0$ $\mu s$ and an instant $t_1=3.5$ $\mu s$, the chopped current $i_e$ is zero.

At instant $t_1$, the chopped current takes on instantaneously the value $i_e=-5$ amps (A). Thereafter, between the instant $t_1$ and an instant $t_2=5$ $\mu s$, the chopped current increases quasi-linearly from the value $i_e=-5$ A to the value $i_e=0$ A. Between $t_1$ and $t_2$, the chopped current is therefore negative.

Between instant $t_2$ and an instant $t_3=6.5$ $\mu s$, the chopped current continues to increase quasi-linearly from the value $i_e=0$ A to $i_e=5$ A. Between $t_2$ and $t_3$, the chopped current is therefore positive.

At instant $t_3$, the chopped current takes on instantaneously the value $i_e=0$ A. Thereafter, from instant $t_3$ to an instant $t_4=10$ $\mu s$, i.e. to the end of the period, the chopped current $i_e$ is zero.

It is desired to measure the chopped current $i_e$ between instants $t_1$ and $t_3$, i.e. while it is increasing quasi-linearly from a first value which is negative, being −5 A, to a second volume which is positive, being 5 A. During this measurement stage, the pulse transformer is magnetized. Demagnetization of the transformer thus takes place starting from instant $t_3$ and it continues so long as the chopped current is zero, i.e. until an instant $t_4+(t_1-t_0)$.

Figure 2:
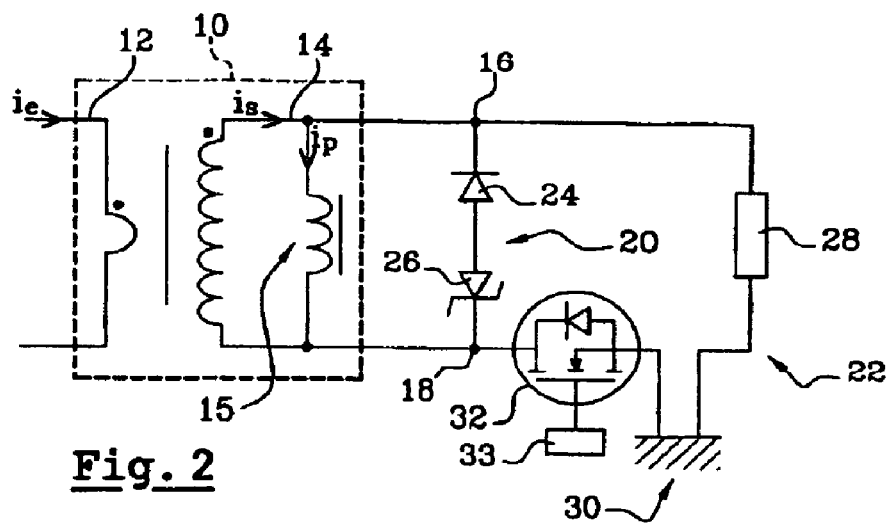
FIG. 2 is a schematic of a measuring device constituting a first embodiment of the invention.

A first embodiment of a device for measuring this chopped current $i_e$ is shown in FIG. 2.

The device comprises a pulse transformer 10 having a primary circuit 12 with $N_p$ turns and a secondary circuit 14 with $N_s$ turns.

The secondary circuit 14 of the pulse transformer 10 has two output terminals 16 and 18. To a first approximation, the imperfections of the transformer 10 can be represented by an inductance 15 placed between the output terminals 16 and 18 and allowing a transformer magnetizing current $i_p$ to flow.

A demagnetizing circuit 20 and a measuring circuit 22 are connected in parallel between the two terminals 16 and 18.

The demagnetizing circuit 20 is constituted by a diode 24 connected in series with a zener diode 26 between the output terminals 16 and 18. The diode 24 is connected in a direction that prevents any current from flowing through the demagnetizing circuit 20 from the output terminal 16 to the output terminal 18. The zener diode 26 is connected in the opposite direction.

The measuring circuit 22 comprises an output resistor 28 connected firstly to the output terminal 16 and secondly to a ground-forming reference point 30 at constant voltage.

The measuring circuit 22 further comprises a switch 32 constituted by a MOSFET. The drain of this transistor 32 is connected to the output terminal 18 and the source of this transistor is connected to ground 30.

The transistor 32 constitutes a switch which is not entirely bidirectional. When it is ON, it is bidirectional and allows current to flow through the measuring circuit 22 in either direction. However, when it is OFF, it is one-directional and prevents current from flowing in one direction only: from the drain to the source.

It is also connected to synchronizing means 33 which control its ON or OFF state as a function of the chopped current. While the chopped current $i_e$ is constantly zero, i.e. between $t_0$ and $t_1$ and between $t_3$ and $t_4$, the synchronizing means 33 control the transistor 32 so that it is in the OFF state. Between instants $t_1$ and $t_3$, while the chopped current $i_e$ is increasing in quasi-linear manner, the synchronizing means 33 control the transistor 32 so that it is in the ON state.

Thus, between the instants $t_1$ and $t_2$, the chopped current $i_e$ is negative and induces an output current is flowing in the secondary circuit 14 from the terminal 16 to the terminal 18. Since the transistor 32 is in the ON state between $t_1$ and $t_2$, current can flow freely in the measuring circuit 22 from the terminal 18 to the terminal 16.

In contrast, no current flows through the demagnetizing circuit 20 since the zener diode 26 is not conductive, given that the voltage across the terminals 18 and 16 is varying and is not equal to its zener voltage.

The output current $i_s$ thus flows through the measuring circuit 22. This has the effect of producing a magnetizing current $i_p$ in the parasitic inductance 15 between the terminals 18 and 16. However since, by design, this magnetizing current $i_p$ is negligible compared with $i_s$, a negative output voltage $V_s$ can be measured between ground 30 and the terminal 16 which is proportional to the chopped current $i_e$.

Between instants $t_2$ and $t_3$, the chopped current $i_e$ is positive and induces an output current $i_s$ flowing from terminal 18 to terminal 16 through the secondary circuit 14. Since the transistor 32 is still in the ON state, this output current also flows through the measuring circuit 22 and the measured voltage $V_s$ continues to be proportional to the chopped current $i_e$.

As before, a magnetizing current flows through the parasitic inductance 15, this time from terminal 16 to terminal 18. However, no current flows through the demagnetizing circuit 20 because it is prevented from flowing by the diode 24.

As from instant $t_3$, no more current flows through the primary circuit 12 of the transformer 10 and the transistor 32 switches to the OFF state. Thus, it no longer allows current to flow from the terminal 18 to the terminal 16 through the measuring circuit 22.

However, at this instant, the magnetizing current $i_p$ flowing through the parasitic inductance 15 flows from the terminal 16 to the terminal 18. This current $i_p$ can thus flow only through the demagnetizing circuit 20, with the potential difference between the terminals 18 and 16 then being determined by the zener voltage of the zener diode 26. As a result, from instant $t_3$ until instant $t_4+(t_1-t_0)$, i.e. so long as the chopped current $i_e$ is zero, the magnetizing current $i_p$ decreases, flowing through the demagnetizing circuit 20.

In order to ensure that the measuring circuit operates correctly, it is necessary for the chopped current $i_e$ to be positive at the instant $t_3$ that the pulse transformer 10 begins to be demagnetized, so as to ensure that the magnetizing current $i_p$ is also positive. If at instant $t_3$ the chopped current $i_e$ were negative, then the magnetizing current $i_p$ would be flowing through the parasitic inductance 15 from terminal 18 terminal 16 and would flow through the measuring circuit 22 instead of flowing through the demagnetizing circuit 20, given that the transistor 32 is not bidirectional when in the OFF state. In this direction it behaves like an ON switch because of its own parasitic diode.

Figure 3:
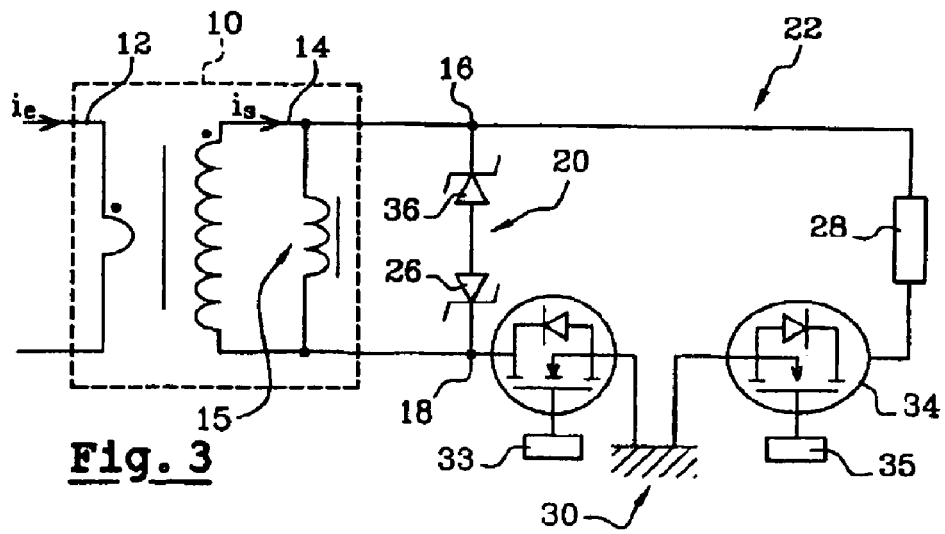
FIG. 3 is a schematic of a measuring device constituting a second embodiment of the invention.

The second embodiment of a measuring device as shown in FIG. 3 differs from the first embodiment described above in the structure of the measuring circuit 22 and the demagnetizing circuit 20.

As before, the measuring circuit 22 includes the transistor 32 connected between the output terminal 18 and ground 30.

However, the output resistor 28 is connected firstly to the output terminal 16 and secondly to the drain of another MOSFET 34, with the source of this other MOSFET 34 being connected to ground 30.

Like the transistor 32, this other transistor 34 is controlled by a synchronizing device 35 identical to the synchronizing device 33. Thus, when the chopped current $i_e$ is not zero, both MOSFETs 32 and 34 are in the ON state, and while the chopped current $i_e$ is zero, both of them are in the OFF state.

The unit constituted by these two transistors 32 and 34 disposed in opposite directions constitutes a switch which is fully bidirectional both in the OFF state and in the ON state.

In addition, in the demagnetizing circuit 20, the diode 24 is replaced by a second zener diode 36 connected in the opposite direction to the zener diode 26. Thus, the demagnetizing circuit 20 is likewise completely bidirectional, i.e. it can enable demagnetization to take place in both current flow directions.

As a result, regardless of the direction in which the magnetizing current flows through the parasitic inductance 15 at instant $t_3$ when the chopped current $i_e$ takes on the value zero, the device enables the pulse transformer 10 to be demagnetized by means of the demagnetizing circuit 20.

It can clearly be seen that a chopped current measuring device of the invention enables any bidirectional current $i_e$ to be measured, i.e. regardless of the waveform and flow direction of the current $i_e$, while nevertheless remaining simple in design.

What is claimed is:

1. A device for measuring a chopped current ($i_e$), the device comprising firstly a pulse transformer (10), the transformer comprising a primary circuit (12) in which the chopped current flows and a secondary circuit (14) in which there flows an output current ($i_s$) proportional to the chopped current, the secondary circuit of the transformer having two output terminals (16, 18) between which there is connected an output current measuring circuit (22), and also means (20) for demagnetizing the transformer, the device being characterized in that the measuring circuit comprises a switch (32, 34) and means (33, 35) for synchronizing the switch with the chopped current ($i_e$) so as to enable the output current ($i_s$) to flow through the measuring circuit (22) whenever the chopped current is strictly positive and whenever it is strictly negative, and to prevent any flow of current through the measuring circuit whenever the chopped current is zero.

2. A measuring device according to claim 1, characterized in that the switch (32) is a MOSFET or a bipolar junction transistor.

3. A device according to claim 1 or claim 2, characterized in that the demagnetizing means (20) comprise a demagnetizing circuit (20) connected between the two output terminals (16, 18) of the secondary circuit of the transformer (10).

4. A measuring device according to claim 3, characterized in that the demagnetizing circuit (20) comprises two zener diodes connected in series and in opposite directions, and in that the switch (32, 34) is bidirectional in the OFF state and in the ON state.

5. A measuring device according to claim 4, characterized in the the switch (32, 34) comprises two MOSFETs connected in series and in opposite directions in the measuring circuit (22).

* * * * *

UNITED STATES PATENT AND TRADEMARK OFFICE
CERTIFICATE OF CORRECTION

PATENT NO. : 6,946,829 B2
DATED : September 20, 2005
INVENTOR(S) : Sardat, Pierre It is certified that error appears in the above-identified patent and that said Letters Patent is hereby corrected as shown below:

Title page,
Item [73], Assignee, replace "Valeo Electronique et Systems de Liaison" with
-- Valeo Electronique et Systemes de Liaison --.
Item [22], PCT Filed, replace "Oct. 19, 2002" with -- Sep. 19, 2002. --.

Signed and Sealed this

Twenty-seventh Day of December, 2005

JON W. DUDAS
*Director of the United States Patent and Trademark Office*